United States Patent [19]

Johnson et al.

[11] 3,852,120

[45] Dec. 3, 1974

[54] METHOD FOR MANUFACTURING ION IMPLANTED INSULATED GATE FIELD EFFECT SEMICONDUCTOR TRANSISTOR DEVICES

[75] Inventors: William S. Johnson, Hopewell Junction; San-mei Ku, Poughkeepsie, both of N.Y.

[73] Assignee: International Business Machines Corporation, Armonk, N.Y.

[22] Filed: May 29, 1973

[21] Appl. No.: 364,800

[52] U.S. Cl. ........................ 148/1.5, 357/23, 357/91

[51] Int. Cl. ................................................ H01l 7/54

[58] Field of Search ........................ 148/1.5; 317/235

[56] References Cited

UNITED STATES PATENTS

| | | | |
|---|---|---|---|
| 3,513,035 | 5/1970 | Fitzgerald et al. | 148/1.5 |
| 3,540,925 | 11/1970 | Athanas et al. | 148/1.5 X |
| 3,736,192 | 5/1973 | Tokuyama | 148/1.5 |
| 3,749,610 | 7/1973 | Swann et al. | 148/1.5 |

*Primary Examiner*—L. Dewayne Rutledge
*Assistant Examiner*—Davis, J. M.
*Attorney, Agent, or Firm*—Wesley DeBruin; Daniel E. Igo

[57] ABSTRACT

A method for manufacturing insulated gate field effect transistor devices utilizing ion implantation for elimination and suppression of mobile ion contamination is described and comprises bombarding and implanting hydrogen or helium into the dielectric insulating layer of an insulated gate field effect transistor at relatively low ion energy, followed by a comparatively low temperature anneal.

7 Claims, 2 Drawing Figures

METHOD FOR MANUFACTURING ION IMPLANTED INSULATED GATE FIELD EFFECT SEMICONDUCTOR TRANSISTOR DEVICES

BACKGROUND OF THE INVENTION

1. Field of the Invention

This invention relates to a process for manufacturing insulated gate semiconductor devices and, more particularly, to a process using ion bombardment and implantation to modify the electrical characteristics of such devices.

In the manufacture of insulated gate semiconductor devices, such as for example, metal oxide semiconductor field effect transistors, difficulties arise due to spurious conditions or contamination in the dielectric layer. This contamination is believed to be alkaline metal ions and particularly sodium. Nevertheless, other contaminants may result in detrimental electrical characteristics of the devices ultimately produced. These contaminants have a tendency to shift the threshold voltage of a device, increase the leakage current characteristics, and generally render the device unstable and unreliable. The dielectric layer is generally deposited in a manner which tends to produce a layer composition deviating in some degree from ideal stoichiometric proportions. It is believed that ionic impurity contaminants in the dielectric layer become mobile and move about when the device is subjected to a magnetic or electrical field.

It is well known to fabricate semiconductor devices and apparatus by forming a coating of an oxide of the semiconductor material on the semiconductor body and using such a coating not only as a mask for fabricating the device but also as a permanent protective film which is left in situ to prevent contamination or other deleterious effects from the atmosphere during processing conditions. This coating in the case of silicon, is usually silicon dioxide on the surface of the silicon transistor body. This type of processing is well known in the art as applied to bipolar, planar devices.

In another type of device called the metal oxide semiconductor field effect transistor and more commonly known as MOSFET, and the insulated gate field effect device known as IGFET, a gate member is formed on the surface of an insulator or dielectric layer on the semiconductor body and over the channel region between source and drain areas formed in the semiconductor body. The gate which is usually of metal, is electrically insulated from the underlying channel region of semiconductor material by an oxide layer which is formed by oxidizing the surface of the semiconductor body. The function of transistors of this type is predicated upon the control of the conductivity of the channel region between the source and drain areas by an electric field established by means of the insulator gate. In a device of this character, majority charge characters (electrons or holes) flow from the source area or region through the channel to the drain area or region. The gate is insulated from the semiconductor body in order to prevent charge carriers from flowing to or from it and thus prevent the gate from acting as a source or drain. Such devices are well known in the art and their structure and operation widely understood.

It is obvious that contaminants in the dielectric or insulating layer can very severely adversely affect the operation of the device as well as its stability.

It is also well known, in addition to forming a single layer, for example of silicon dioxide on a silicon semiconductor body, to form a composite layer comprising silicon dioxide and, for example, silicon nitride. The silicon nitride layer superimposed on the silicon dioxide layer produces a more dense layer and composite which is thought to act as a better diffusion barrier than the single oxide layer. These and other characteristics of the insulated gate field effect transistor devices are disclosed in U.S. Pat. No. 3,707,656 issued Dec. 26, 1972, and co-pending application Ser. No. 357,046 filed May 4, 1973 for R. H. Collins, et al. entitled "Reliable MOSFET Device and Method for Making Same" granted as U.S. Pat. No. 3,756,862 on Sept. 4, 1973.

2. Description of the Prior Art

The prior art has taught improved semiconductor devices made by the method of proton enhanced diffusion. A semiconductor wafer having a buried subcollector region is raised to an elevated temperature and exposed to an accelerated beam of hydrogen or helium ions which may be focused or directed through a mask. The beam is rendered incident on the subcollector region. The ions penetrating the subcollector region enhance the diffusion of the subcollector type impurities producing a pedestal and a collector reach-through for a pedestal transistor. The transistor produced thereby has a uniformly narrow base width having a relatively long minority carrier lifetime and very steep impurity profiles. An improved diffusion capacitor IGFET and sub-surface diffused interconnection is also made by the method of proton enhanced diffusion. A detailed description of the solution of diffusion problems by proton enhancement is described in co-pending Application Ser. No. 210,464 filed Dec. 21, 1971 for J. Ahn, et al. entitled "Proton Enhanced Diffusion Devices and Methods," assigned to the assignee of the instant invention granted as U.S. Pat. No. 3,756,682 on Sept. 4, 1973.

The solution to contaminating mobile ions has been to some degree solved by the employment according to the prior art in the use of composite dielectric layers comprising silicon dioxide and an overlying film of phosphosilicate glass. One of the beneficial results obtained by the use of phosphosilicate glass for stabilizing the silicon dioxide dielectric layer is not completely understood. They are discussed in an article by D. R. Kerr, et al. entitled "Stabilization of $SiO_2$ Passivation Layers with $P_2O_5$" reported in the IBM Journal of Research and Development, Volume 8, (1964) at page 376.

The prior art has taught the method of manufacturing an insulated gate semiconductor device wherein at an intermediate stage of the manufacture, the insulating (dielectric) layer which underlies the gate electrode is bombarded with ions from a glow discharge type of device or apparatus. The bombardment is accomplished by subjecting the device to an atmosphere containing an ionizable gas and applying a voltage between the spaced electrodes exposed to the gas, the voltage being sufficiently high to ionize the gas so the gas ions bombard the surface of the insulating layer. In particular, this segment of the prior art has taught the use of an argon atmosphere at low pressure and the use of a high voltage between electrodes exposed to the argon gas to ionize the gas and initiate a glow discharge while leaving the device being fabricated in the glow discharge region for a predetermined time so that ions from the discharge region bombard the dielectric layer.

SUMMARY OF THE INVENTION

It is an object of this invention to provide a method for the manufacture and production of stabilized insulated gate field effect transistor devices whereby the threshold voltage is not adversely affected by impurities or contaminants in the insulating dielectric layer.

It is still a further object of this invention to provide insulated gate field effect transistor devices having minimized leakage currents and a gate region substantially insulated from the source and drain areas.

It is still a further object of this invention to provide a method of ion bombardment to immobilize or getter dielectric layer contaminants using relatively low ion energy and thereby simplifying or making available the use of ordinary, low energy implantation apparatus.

It is still a further object of this invention to provide improved insulated gate field effect transistor devices employing either N-channel or P-channel type diffused source and drain regions.

The foregoing and other objects, features and advantages of this invention will be apparent from the ensuing detailed description and specific embodiments of the invention and although reference is made to specific embodiments and drawings, it is not intended that the invention be limited to these specifics. The foregoing and other objects are accomplished according to this invention by implanting hydrogen or helium ions into the insulating or dielectric layer of an insulated gate field effect transistor in the range of from $10^{10}$ to $10^{14}$ ions per sq.cm, followed by an anneal between 200°C and 750°C.

The drawings described above and made part of this application are for illustrative purposes only and are not intended in any way to limit or restrict the invention herein described but to aid and facilitate in more adequately describing the detailed embodiments of the overall concept of the invention.

DESCRIPTION OF THE PREFERRED EMBODIMENTS

Figure 1:
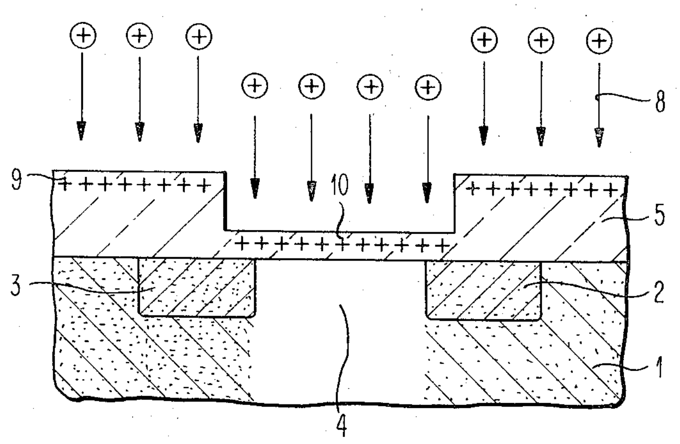
FIG. 1 is a cross-sectional illustration of an insulated gate FET structure showing the source and drain regions prior to deposition of gate metallurgy over the dielectric layer.
Figure 2:
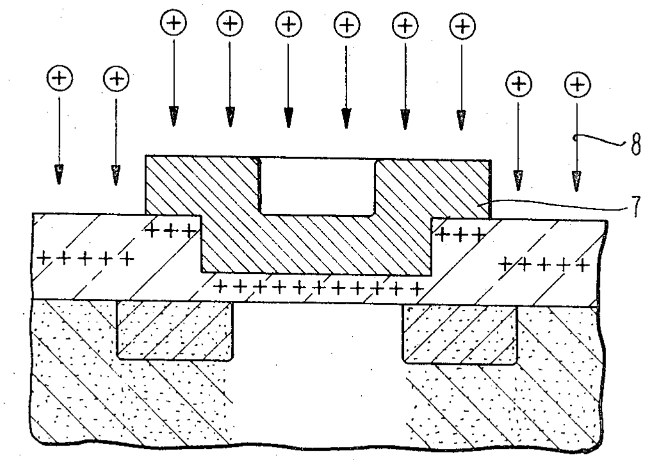
FIG. 2 is a similar cross-sectional view of an insulated gate FET structure showing the source and drain regions having superimposed thereon the insulating or dielectric layer as well as gate contact metallurgy.

FIG. 1 illustrates a partially manufactured insulated gate field effect transistor device showing the semiconductor substrate 1 which in the conventional device can be silicon or any other suitable semiconductor material wherein is formed a source region 2 and a drain region 3 having a channel region designated as 4, and a dielectric or insulating passivating layer 5 which has been etched by conventional photolithographic techniques or otherwise, to form a gate area 6 wherein in subsequent process steps the gate contact metallurgy is provided and is further illustrated in FIG. 2 at 7. The ion bombardment is illustrated by the arrows 8 and can be carried out either before or after the gate metallurgy has been installed.

Any suitable ion implantation equipment is adaptable to carry out this invention. Briefly, an atom of some element is ionized in an ion source and accelerated by a potential gradient through an accelerator to obtain energy high enough or sufficient to be implanted in a target within a target chamber. Since an ion beam of particles is charged, it is affected by a magnetic and electric field. Consequently, it can be focused and reflected in a chamber by a mass separation magnet. It is generally considered in order to prevent surface damage from cold working by an ion beam, the target or wafer may be heated slightly or maintained at a temperature which will aid the implantation. This is not believed to be of critical necessity but may aid in the implanting of ions into a target. However, it is not an essential element of this invention because the dielectric layer can be implanted at room temperature ambient.

It is obvious from the drawings and the prior art that the ion energy measured in KeV necessary to implant ions into a target or substrate will be dependent upon the depth of penetration desired and in this particular invention, upon the thickness of the dielectric layer. FIG. 1 illustrates the ion penetration at 9 and 10. the dielectric thickness at 9 is much greater than the etched out area at 10. Therefore, the implanted ions will be found at different locations or depths due to the thickness of the insulating layer into which the implantation is made. Obviously, as illustrated in FIG. 2 where the implantation is carried out through the insulated gate metallurgy, more ion energy is required. Consequently, the depth of implantation in the non-etched out or areas other than the gate region will be somewhat deeper than that illustrated in FIG. 1. The ions suitable for carrying out this invention are hydrogen ($H_1^{115}$ and $H_2^{115}$) and helium in a dosage of between $10^{10}$ to $10^{14}$ ions/sq.cm. Ion energy required in terms of KeV will be dependent upon the depth of implantation, the nature of the dielectric region and its thickness. These requirements are well known and are easily calculable by one skilled in the art. Following implantation, the device is annealed at a temperature between 200°–750° C. Optimum annealing temperatures for insulated gate field effect transistor devices formed on silicon substrates utilizing a dielectric of $SiO_2$ or a combination of $SiO_2$ and $Si_3N_4$ is between 425°–450° C. This invention will be more adequately and further described with reference to the following specific examples which are intended for illustrative purposes and not in any way to limit the invention disclosed herein.

EXAMPLE I

A metal nitride oxide composite semiconductor device having a composite dielectric layer of 300A/300A of $SiO_2/Si_3N_4$ as illustrated in FIG. 1 and having mobile $Na^+$ of $4 \times 10^{11}$ was subjected to $H_2^+$ implantation at 10 KeV ion energy for a dosage of $3 \times 10^{13}$ ions/sq.cm, and subsequently furnishing aluminum metallization illustrated in FIG. 2 and annealed at 450° C in nitrogen for 10–15 minutes, whereupon the device showed a decrease of sodium mobile charge level to $4 \times 10^{10}$ as measured by the standard IV loop technique and confirmed by no shift of the flat band voltage in the negative direction under stress bias conditions.

EXAMPLE II

A procedure similar to Example I was followed except that helium ($He^+$) ions were implanted at 7 KeV at a dosage of $6 \times 10^{13}$ ions/sq.cm into devices having a sodium ($Na^+$) mobile charge level of $1.1 \times 10^{11}$ and upon completion and testing the mobile sodium charge level was less than $10^{10}$.

EXAMPLE III

A procedure similar to Example II was followed except that the semiconductor device contained only a metal oxide dielectric layer of 500A of $SiO_2$ and had a mobile sodium charge level of $1.8 \times 10^{11}$ and the helium was implanted to a dosage of $1 \times 10^{12}$ ions/sq.cm under the same ion KeV energy. The mobile sodium ion level was reduced to $3 \times 10^{10}$.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A method for ion implanting the dielectric layer on an insulated gate field effect transistor comprising implanting ions selected from the group consisting of hydrogen and helium to a dose of between $10^{10}$ to $10^{14}$ per square centimeter and annealing the implanted device at a temperature of between 200° – 750° C, whereby mobile ion contamination due to alkaline metal ions and in particular sodium in said dielectric layer is substantially eliminated and suppressed.

2. A method in accordance with claim 1 wherein said implanted ions are hydrogen.

3. A method in accordance with claim 1 wherein said implanted ions are helium.

4. A method in accordance with claim 1 wherein said dielectric layer is $SiO_2$.

5. A method in accordance with claim 1 wherein said dielectric layer is $Si_3N_4$.

6. A method in accordance with claim 1 wherein said dielectric layer is a composite layer of $SiO_2$ and $Si_3N_4$.

7. A method in accordance with claim 1 wherein said annealing temperature is between 425° and 450° C for a period of between 10 and 15 minutes.

* * * * *